United States Patent
Jung et al.

(10) Patent No.: US 9,455,405 B2
(45) Date of Patent: Sep. 27, 2016

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-Do (KR)

(72) Inventors: Myungjong Jung, Yongin (KR); Jinwoo Park, Yongin (KR); Wonjun Song, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/574,153

(22) Filed: Dec. 17, 2014

(65) Prior Publication Data

US 2016/0020399 A1    Jan. 21, 2016

(30) Foreign Application Priority Data

Jul. 17, 2014 (KR) .................. 10-2014-0090352

(51) Int. Cl.
| | | |
|---|---|---|
| H01L 51/00 | (2006.01) | |
| H01L 51/56 | (2006.01) | |
| H01L 27/32 | (2006.01) | |
| H01L 51/52 | (2006.01) | |

(52) U.S. Cl.
CPC ....... *H01L 51/0023* (2013.01); *H01L 51/5225* (2013.01); *H01L 27/3244* (2013.01); *H01L 2251/558* (2013.01)

(58) Field of Classification Search
CPC  H01L 51/5275; H01L 51/56; H01L 51/5253
USPC ............................................... 257/40; 438/34
See application file for complete search history.

(56) References Cited

U.S. PATENT DOCUMENTS

| | | | |
|---|---|---|---|
| 2004/0211971 A1 | 10/2004 | Takei et al. | |
| 2011/0121346 A1* | 5/2011 | Yamada | H01L 51/5234 257/98 |
| 2012/0194563 A1 | 8/2012 | Liang et al. | |
| 2012/0286651 A1* | 11/2012 | Levermore | H05B 33/10 313/504 |
| 2014/0034919 A1* | 2/2014 | Park | H01L 51/5275 257/40 |
| 2014/0065750 A1 | 3/2014 | Mohan et al. | |

FOREIGN PATENT DOCUMENTS

| | | |
|---|---|---|
| JP | 2003-332067 A | 11/2003 |
| JP | 2013-149536 A | 8/2013 |
| KR | 10-2008-0061525 A | 7/2008 |

* cited by examiner

*Primary Examiner* — Walter H Swanson
(74) *Attorney, Agent, or Firm* — Knobbe Martens Olson & Bear LLP

(57) ABSTRACT

An organic light-emitting diode (OLED) display and a method of manufacturing the same are disclosed. In one aspect, the OLED display includes a substrate, a plurality of pixel electrodes formed on the substrate and separated from each other. The OLED display also includes an opposite electrode formed as one body and corresponding to the pixel electrodes, wherein the thickness of the opposite electrode varies depending on a position. The OLED display further includes an intermediate layer formed between the pixel electrodes and the opposite electrode, wherein the intermediate layer includes at least an emission layer.

11 Claims, 5 Drawing Sheets

ORGANIC LIGHT-EMITTING DIODE (OLED) DISPLAY AND METHOD OF MANUFACTURING THE SAME

CROSS-REFERENCE TO RELATED APPLICATIONS

This application claims the benefit of Korean Patent Application No. 10-2014-0090352, filed on Jul. 17, 2014, in the Korean Intellectual Property Office, the disclosure of which is incorporated herein in its entirety by reference.

BACKGROUND

1. Field

The described technology generally relates to an organic light-emitting diode (OLED) display and a method of manufacturing the same.

2. Description of the Related Technology

OLED displays include each (sub)pixel including an OLED in which an intermediate layer including an emission layer is formed between a pixel electrode and an opposite electrode. In the OLED displays, emission of light from or a degree of emission of each pixel is controlled by a thin film transistor electrically connected to the pixel electrode, and the opposite electrode has a one-body type in a plurality of (sub)pixels.

SUMMARY OF CERTAIN INVENTIVE ASPECTS

One inventive aspect is an OLED display and a method of manufacturing the same, which enable a user to appreciate a high-quality image.

Another aspect is an OLED display which includes: a substrate; a plurality of pixel electrodes that are formed on the substrate, and are separated from each other; an opposite electrode that is formed as one body and corresponds to the plurality of pixel electrodes, wherein a thickness of the opposite electrode is changed depending on a position; and an intermediate layer that is formed between the plurality of pixel electrodes and the opposite electrode, and includes at least an emission layer.

The opposite electrode may include a plurality of first portions and a plurality of second portions having a thinner thickness than thicknesses of the plurality of first portions.

The opposite electrode may include a plurality of third portions that connect the plurality of first portions to the plurality of second portions, and a thickness of each of the plurality of third portions may become gradually thinner in a direction from a position, which is adjacent to a corresponding first portion, to a position adjacent to a corresponding second portion.

The substrate may have a plate shape which has a long axis and a short axis, and the opposite electrode may include the plurality of first portions, the plurality of third portions, and the plurality of second portions which are alternately formed along the long axis direction of the substrate.

The opposite electrode may include the plurality of first portions, the plurality of third portions, and the plurality of second portions which are alternately formed along the short axis direction of the substrate.

A thickness of the opposite electrode may be uniform along the short axis direction of the substrate.

The first portions of the opposite electrode may correspond to central portions of the plurality of pixel electrodes.

A thickness of each of the first portions of the opposite electrode may be uniform.

The opposite electrode may include: a plurality of first portions that are separated from each other; and a plurality of third portions that are formed between the plurality of first portions and becomes gradually thinner as being farther away from the plurality of first portions.

The substrate may have a plate shape which has a long axis and a short axis, and the opposite electrode may include the plurality of first portions and the plurality of third portions which are alternately formed along the long axis direction of the substrate.

The opposite electrode may include the plurality of first portions and the plurality of third portions which are alternately formed along the short axis direction of the substrate.

Another aspect is a method of manufacturing an OLED display which includes: forming a plurality of pixel electrodes, which are separated from each other, on a substrate; forming an intermediate layer, which includes an emission layer, on the plurality of pixel electrodes; and forming an opposite electrode as one body, which corresponds to the plurality of pixel electrodes, on the intermediate layer, wherein a thickness of the opposite electrode is changed depending on a position.

The forming of the opposite electrode may include depositing a material for forming the opposite electrode in a state where a mask having a plurality of openings is separated from a surface, in which the opposite electrode is to be formed, by a predetermined distance.

The forming of the opposite electrode may include depositing the material for forming the opposite electrode in a state where the mask is formed so that centers of the plurality of openings of the mask correspond to the centers of plurality of pixel electrodes.

The forming of the opposite electrode may include forming the opposite electrode that includes a plurality of first portions corresponding to centers of the plurality of openings of the mask, a plurality of second portions which correspond to a portion between the plurality of openings of the mask and have a thinner thickness than those of the plurality of first portions, and a plurality of third portions which connect the plurality of first portions to the plurality of second portions and become gradually thinner in a direction from a position, which is adjacent to a corresponding first portion, to a position adjacent to a corresponding second portion.

The substrate may have a plate shape which has a long axis and a short axis, and the forming of the opposite electrode may include forming the opposite electrode that includes the plurality of first portions, the plurality of third portions, and the plurality of second portions which are alternately formed along the long axis direction of the substrate.

The forming of the opposite electrode may include forming the opposite electrode that includes a plurality of first portions corresponding to centers of the plurality of openings of the mask and a plurality of third portions which correspond to a portion between the plurality of openings of the mask and become gradually thinner as being farther away from a corresponding first portion.

The substrate may have a plate shape which has a long axis and a short axis, and the forming of the opposite electrode may include forming the opposite electrode that includes the plurality of first portions and the plurality of third portions which are alternately formed along the long axis direction of the substrate. The forming of the opposite electrode may include forming the opposite electrode for a thickness to be uniform along the short axis direction of the substrate.

Another aspect is an organic light-emitting diode (OLED) display comprising: a substrate; a plurality of pixel electrodes formed on the substrate and separated from each other; an opposite electrode formed as one body and corresponding to the pixel electrodes, wherein the thickness of the opposite electrode varies depending on a position; and an intermediate layer formed between the pixel electrodes and the opposite electrode, wherein the intermediate layer includes at least an emission layer.

In the above OLED display, the opposite electrode comprises a plurality of first portions and a plurality of second portions, and wherein the thickness of each of the first portions is greater than that of each of the second portions. In the above OLED display, the opposite electrode comprises a plurality of third portions interconnecting the first portions and the second portions, and wherein each of the third portions becomes gradually thinner in a direction from a position, which is adjacent to a corresponding first portion, to a position adjacent to a corresponding second portion. In the above OLED display, the substrate has a plate shape which has a long axis and a short axis, and wherein the first portions, the third portions, and the second portions are alternately formed along the long axis direction of the substrate.

In the above OLED display, the first portions, the third portions, and the second portions are alternately formed along the short axis direction of the substrate. In the above OLED display, the thickness of the opposite electrode is substantially uniform along the short axis direction of the substrate. In the above OLED display, the first portions of the opposite electrode are substantially directly above central portions of the pixel electrodes. In the above OLED display, the thickness of each of the first portions of the opposite electrode is substantially uniform. In the above OLED display, the opposite electrode comprises: a plurality of first portions separated from each other; and a plurality of third portions formed between the first portions and become gradually thinner as being farther away from the first portions.

In the above OLED display, the substrate has a plate shape which has a long axis and a short axis, and wherein the first portions and the third portions are alternately formed along the long axis direction of the substrate. In the above OLED display, the first portions and the third portions are alternately formed along the short axis direction of the substrate. In the above OLED display, the opposite electrode comprises a plurality of protrusions spaced apart from each other, and wherein the protrusions are located substantially directly above central portions of the pixel electrodes.

Another aspect is a method of manufacturing an organic light-emitting diode (OLED) display, the method comprising: forming a plurality of pixel electrodes, which are separated from each other, on a substrate; forming an intermediate layer, which includes an emission layer, on the pixel electrodes; and forming an opposite electrode as one body, which corresponds to the pixel electrodes, on the intermediate layer, wherein the thickness of the opposite electrode varies depending on a position.

In the above method, the forming of the opposite electrode comprises depositing a material for forming the opposite electrode in a state where a mask having a plurality of openings is separated from a surface, in which the opposite electrode is to be formed, by a predetermined distance. In the above method, the forming of the opposite electrode comprises depositing the material for forming the opposite electrode in a state where the mask is formed so that central portions of the openings of the mask correspond to central portions of the pixel electrodes. In the above method, the forming of the opposite electrode comprises forming the opposite electrode that includes i) a plurality of first portions corresponding to the central portions of the openings of the mask, ii) a plurality of second portions which correspond to a portion between the openings of the mask and are thicker than those of the first portions, and iii) a plurality of third portions which connect the first portions to the second portions and become gradually thinner in a direction from a position, which is adjacent to a corresponding first portion, to a position adjacent to a corresponding second portion.

In the above method, the substrate has a plate shape which has a long axis and a short axis, and wherein the first portions, the third portions, and the second portions are alternately formed along the long axis direction of the substrate. In the above method, the forming of the opposite electrode comprises forming the opposite electrode that includes a plurality of first portions corresponding to the central portions of the openings of the mask and a plurality of third portions which correspond to a portion between the openings of the mask and become gradually thinner as being farther away from a corresponding first portion. In the above method, the substrate has a plate shape which has a long axis and a short axis, and wherein the first portions and the third portions are alternately formed along the long axis direction of the substrate. In the above method, the forming of the opposite electrode comprises forming the opposite electrode such that the thickness of the opposite electrode is substantially uniform along the short axis direction of the substrate.

DETAILED DESCRIPTION OF CERTAIN INVENTIVE EMBODIMENTS

Figure 1:
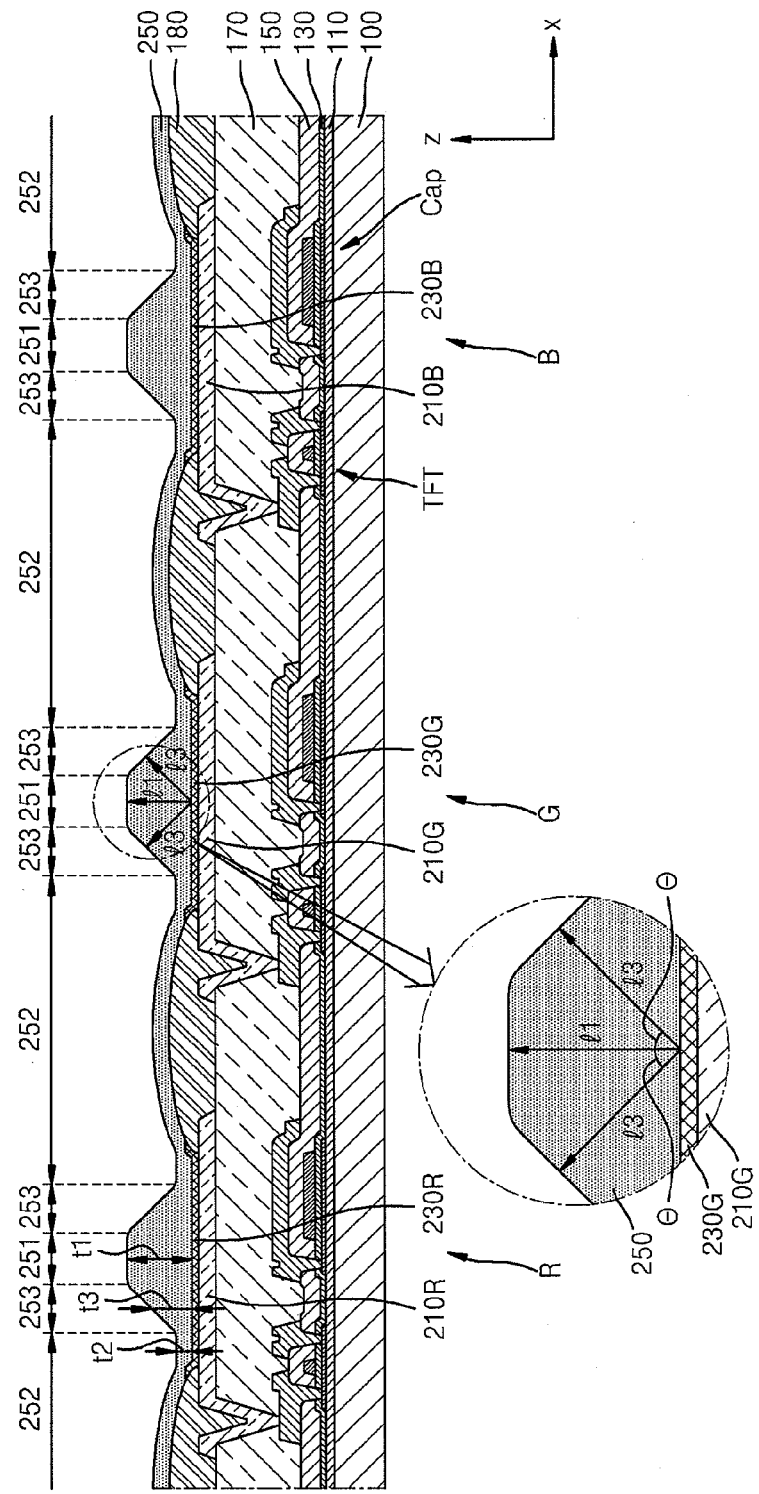
FIG. 1 is a cross-sectional view schematically illustrating a portion of an OLED display according to an embodiment.

Generally, OLED display has a problem in which a color balance is changed depending on a viewing angle.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Embodiments of the inventive concept may impose various transformations that may have various embodiments, and specific embodiments illustrated in the drawings will be described in detail in the detailed description. The effects and features of the inventive concept will become apparent from the following description of the embodiments with reference to the accompanying drawings, which is set forth hereinafter. The inventive concept may, however, may be embodied in different forms and should not be construed as being limited to the embodiments set forth herein.

Hereinafter, embodiments will be described in detail with reference to the accompanying drawings. In addition, in the present specification and drawings, like reference numerals refer to like elements throughout, and thus, redundant descriptions are omitted.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. In this disclosure, the term "substantially" includes the meanings of completely, almost completely or to any significant degree under some applications and in accordance with those skilled in the art. Moreover, "formed on" can also mean "formed over." The term "connected" includes an electrical connection.

FIG. 1 is a cross-sectional view schematically illustrating a portion of an OLED display according to an embodiment. The OLED display includes a substrate 100, a plurality of pixel electrodes 210R, 210G and 210B which are separated from each other, an opposite electrode 250 which is formed as one body and corresponds to the pixel electrodes 210R, 210G and 210B, and a plurality of intermediate layers 230R, 230G and 230B which are formed between the pixel electrodes 210R, 210G and 210B and the opposite electrode 250 and include at least an emission layer. In addition, the OLED display may further include various elements. It may be understood that the pixel electrodes 210R, 210G and 210B correspond to a red sub-pixel R, a green sub-pixel G, and a blue sub-pixel B, respectively.

The substrate 100 may be formed of various materials such as a glass material, a metal material, and a plastic material such as polyethylene terephthalate (PET), polyethylen naphthalate (PEN), or polyimide.

Each of the pixel electrodes 210R, 210G and 210B may be a (semi)transparent electrode or a reflective electrode. When each of the pixel electrodes 210R, 210G and 210B is the (semi)transparent electrode, the pixel electrodes 210R, 210G and 210B may be formed of indium tin oxide (ITO), indium zinc oxide (IZO), zinc oxide (ZnO), indium oxide ($In_2O_3$), indium gallium oxide (IGO), or aluminum zinc oxide (AZO). In this case, the OLED display may be a dual emission type. When each of the pixel electrodes 210R, 210G and 210B is the reflective electrode, the pixel electrodes 210R, 210G and 210B may include a reflective layer, which is formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer which is formed of ITO, IZO, ZnO, or $In_2O_3$. In this case, the OLED display may be a top emission type in which light is output to the outside through the opposite electrode 250. Also, configurations and materials of the pixel electrodes 210R, 210G and 210B are not limited thereto, and may be variously modified.

At least one edge of each of the pixel electrodes 210R, 210G and 210B may be covered by a pixel defining layer 180. The pixel defining layer 180 may have an opening (e.g., an opening which exposes a central portion of each of the pixel electrodes 210R, 210G and 210B or exposes a whole portion of each of the pixel electrodes 210R, 210G and 210B) corresponding to each sub-pixel, and thus define a pixel. Also, the pixel define layer 180 enlarges a distance between an end of each of the pixel electrodes 210R, 210G and 210B and the opposite electrode 250 formed on the pixel electrodes 210R, 210G and 210B, thereby preventing an arc from occurring in the end of each of the pixel electrodes 210R, 210G and 210B.

In addition to the elements, as illustrated in FIG. 1, the OLED display may include a thin film transistor TFT or a capacitor Cap which is formed on the substrate 100. The OLED display may include a buffer layer 110 which is formed for preventing impurities from penetrating into a semiconductor layer of the thin film transistor TFT, a gate insulating layer 130 which is formed for insulating the semiconductor layer from a gate electrode of the thin film transistor TFT, an interlayer insulating layer 150 which is formed for insulating a source/drain electrode from the gate electrode of the thin film transistor TFT, and a planarizing layer 170 of which a top is approximately planar or a protective layer (not shown)

The intermediate layers 230R, 230G and 230B may have a multilayer structure including an emission layer. In this case, unlike the illustrated, at least one layer of the intermediate layers 230R, 230G and 230B may be a common layer which is formed as one body in correspondence with a whole surface of the substrate 100, and the other layer may be a pattern layer which is patterned to correspond to the pixel electrodes 210R, 210G and 210B. The intermediate layers 230R, 230G and 230B may be formed of a low-molecular material or a polymer material, and may include a hole injection layer, a hole transport layer, an emission layer, an electron transport layer and/or an electron injection layer. The intermediate layers 230R, 230G and 230B may be formed by various methods such as a deposition method, a spin coating method, an inkjet printing method, and/or a laser thermal transfer method.

The opposite electrode 250, as described above, may be formed as one body in the pixel electrodes 210R, 210G and 210B. That is, the opposite electrode 250 may be formed as one body to correspond to the whole surface of the substrate 100. The opposite electrode 250 may be formed of a (semi)transparent electrode. In this case, the opposite electrode 250 may include a layer, which is formed of metal (i.e., Li, Ca, LiF/Ca, LiF/Al, Al, Ag, Mg, and a compound thereof) having a small work function, and a (semi)transparent conductive layer such as ITO, IZO, ZnO, or $In_2O_3$. A configuration and a material of the opposite electrode 250 are not limited thereto, and may be variously modified. In some embodiments, the opposite electrode 250 includes a plurality of protrusions spaced apart from each other, and the protrusions are located substantially directly above central portions of the pixel electrodes.

The thickness of the opposite electrode 250, as illustrated in FIG. 1, may be changed depending on a position. In detail, the opposite electrode 250 may include a plurality of first portions 251 and a plurality of second portions 252 which are thinner than the first portions 251. The first portions 251 may correspond to central portions of the plurality of pixel electrodes 210R, 210G and 210B. In this case, the opposite electrode 250 may include a plurality of third portions 253 which connect the first portions 251 to the second portions 252. The thickness of each of the third portions 253, as illustrated in FIG. 1, may become gradually thinner in a direction from a position, which is adjacent to the first portion 251, to a position adjacent to the second portion 252.

Light, emitted from an emission layer in each of the intermediate layers 230R, 230G and 230B of the OLED display, is output to the outside through the opposite electrode 250. In this case, transmittances by wavelength band and a full width at half maximum are changed depending on a length of a light path in the opposite electrode 250. For example, a transmittance is lowered as a thickness of the opposite electrode 250 becomes thicker, and a degree to which the transmittance is lowered is changed depending on a wavelength of light.

Therefore, when the thickness of the opposite electrode 250 of the OLED display is substantially constant in the whole surface of the substrate 100, a color balance of an image recognized by a user is differently shown depending on a viewing angle. This is because when the user views the OLED display from the front which is substantially vertical to a screen of the OLED display, the length of a light path in the opposite electrode 250 is approximately similar to the thickness of the opposite electrode 250, but when the user views the OLED display in an askew direction which is not vertical to the screen of the OLED display, the length of the light path in the opposite electrode 250 is greater than the thickness of the opposite electrode 250.

However, in the OLED display, the thickness of the opposite electrode 250 is changed depending on a position, and thus, a change in a color balance is minimized despite a change in a viewing angle.

As illustrated in FIG. 1, when the user views the OLED display from the front which is substantially vertical to the screen of the OLED display, most of output light recognized by the user passes through the first portion 251 of the opposite electrode 250, and thus, the length of the light path in the opposite electrode 250 is l1 corresponding to a thickness t1 of the first portion 251 of the opposite electrode 250. When the user views the OLED display in an askew direction (corresponding to an angle θ) which is not vertical to the screen of the OLED display, most of the output light recognized by the user passes through the third portion 253 of the opposite electrode 250, and thus, the length of the light path in the opposite electrode 250 is l3. In this case, since the thickness t3 of the third portion 253 of the opposite electrode 250 is less than the thickness t1 of the first portion 251, a length l3 of the light path in the opposite electrode 250 is not greater than l1, and l1 may be approximately similar to l3. Therefore, in the OLED display, despite a change in a viewing angle, a color balance of an image recognized by the user is not greatly changed.

In this case, as illustrated in FIG. 1, the thickness t1 of each of the first portions 251 of the opposite electrode 250 may be constant. That is, a top (+z direction) of a portion corresponding to each of the pixel electrodes 210R, 210G and 210B of the opposite electrode 250 may be planar. Therefore, when the user views the OLED display from the front corresponding to a substantially vertical direction with respect to the screen of the OLED display, color coordinates in the vertical direction are prevented from being shaken.

In a case where the top (+z direction) of the portion corresponding to each of the pixel electrodes 210R, 210G and 210B of the opposite electrode 250 is planar, even when a position of a viewer in the substantially vertical direction is slightly changed along an x axis, a length of a light path of light (reaching the viewer) in the opposite electrode 250 is maintained as l1 corresponding to the thickness t1 of each of the first portions 251 of the opposite electrode 250. Therefore, even when the position of the viewer is slightly changed, the color coordinates in the substantially vertical direction is maintained without being shaken. For example, in a case where the top (+z direction) of the portion corresponding to each of the pixel electrodes 210R, 210G and 210B of the opposite electrode 250 is not planar, when the position of the viewer in the substantially vertical direction is slightly changed along the x axis, the length of the light path of the light (reaching the viewer) in the opposite electrode 250 is changed, and for this reason, a color balance is broken. This is applied to below-described embodiments and modification embodiments.

In FIG. 1, the second portion 252 between the third portions 253 of the opposite electrode 250 is illustrated as having a substantially uniform thickness, but the present embodiment is not limited thereto. The thickness of the second portion 252 may not be uniform. Also, the second portion 252 having a thinner thickness than that of the first portion 251 is formed between the third portions 253, and in addition to the second portion 252, a fourth portion (not shown) may be formed between the third portions 253. Depending on the case, a thickness of the fourth portion may be the same as or thicker than that of the first portion 251. This is applied to below-described embodiments and modification embodiments.

Figure 2:
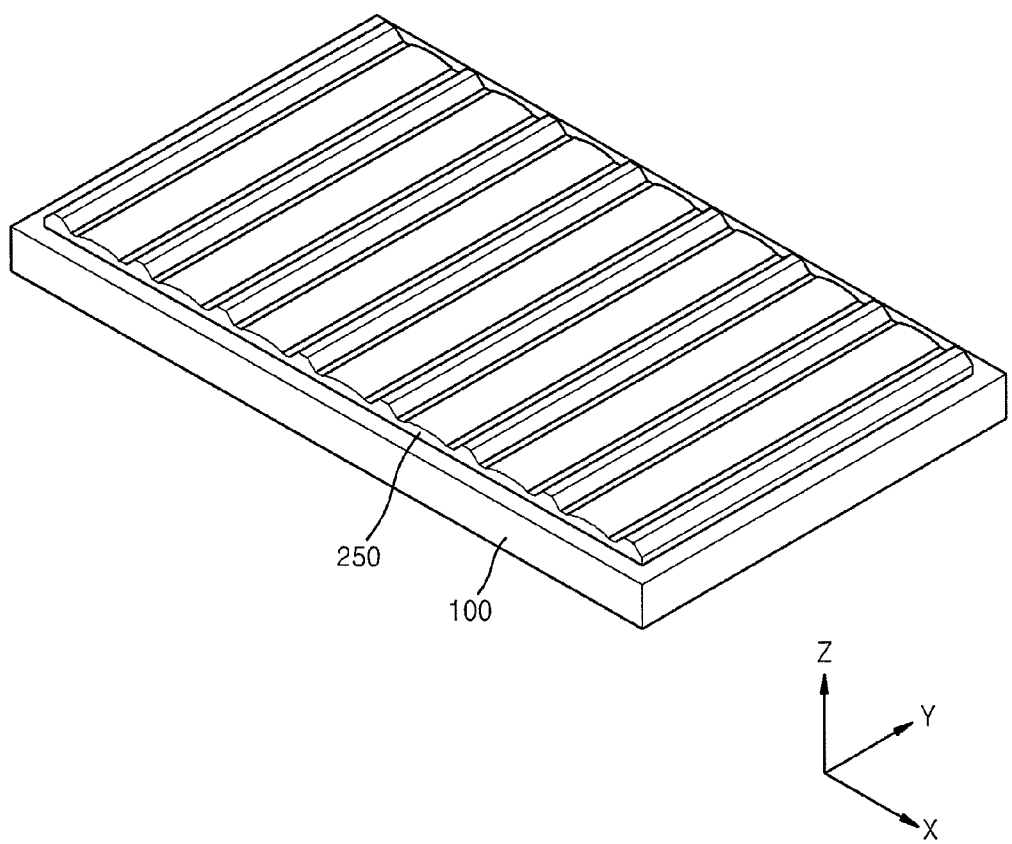
FIG. 2 is a perspective view schematically illustrating a portion of an OLED display according to another embodiment.

FIG. 2 is a perspective view schematically illustrating a portion of an OLED display according to another embodiment. In FIG. 2, the substrate 100 is illustrated as having a plate shape which has a long axis in an x axis direction and a short axis in a y axis direction. For reference, in FIG. 2, for convenience, only the substrate 100 and the opposite electrode 250 are illustrated, and even in a case of a shape of the opposite electrode 250, a bending of a lower surface formed by the pixel defining layer 180 formed thereunder is omitted. Furthermore, in FIG. 2, in a case of the opposite electrode 250 including the first portions 251 corresponding to (sub) pixels, sizes of the first portions 251 are exaggerated compared to actual sizes of the (sub)pixels.

As illustrated in FIG. 2, the opposite electrode 250 may include the first portion 251, the third portion 253, and the second portion 252 which are alternately formed along the long axis direction (which is the x axis direction) of the substrate 100. However, the thickness of the opposite electrode 250 may be constant along the short axis direction (which is the y axis direction) of the substrate 100. This is because in a state where the OLED display is formed so that the long axis of the substrate 100 is formed to correspond to a left and right direction of a viewer, the viewer views an image displayed by the OLED display, and moreover, a viewing angle is changed in the long axis direction of the substrate 100, but the viewing angle is not changed in the short axis direction of the substrate 100. Therefore, the thickness of the opposite electrode 250 is constant along the short axis direction (which is the y axis direction) of the substrate 100, and thus, a shape of the opposite electrode 250 is simplified, thereby facilitating a manufacturing process. Also, despite a change in a viewing angle, a color balance is maintained in the long axis direction of the substrate 100. Depending on the case, the opposite electrode 250 may include the first portion 251, the third portion 253, and the second portion 252 which are alternately formed along the short axis direction (which is the y axis direction) of the substrate 100.

Figure 3:
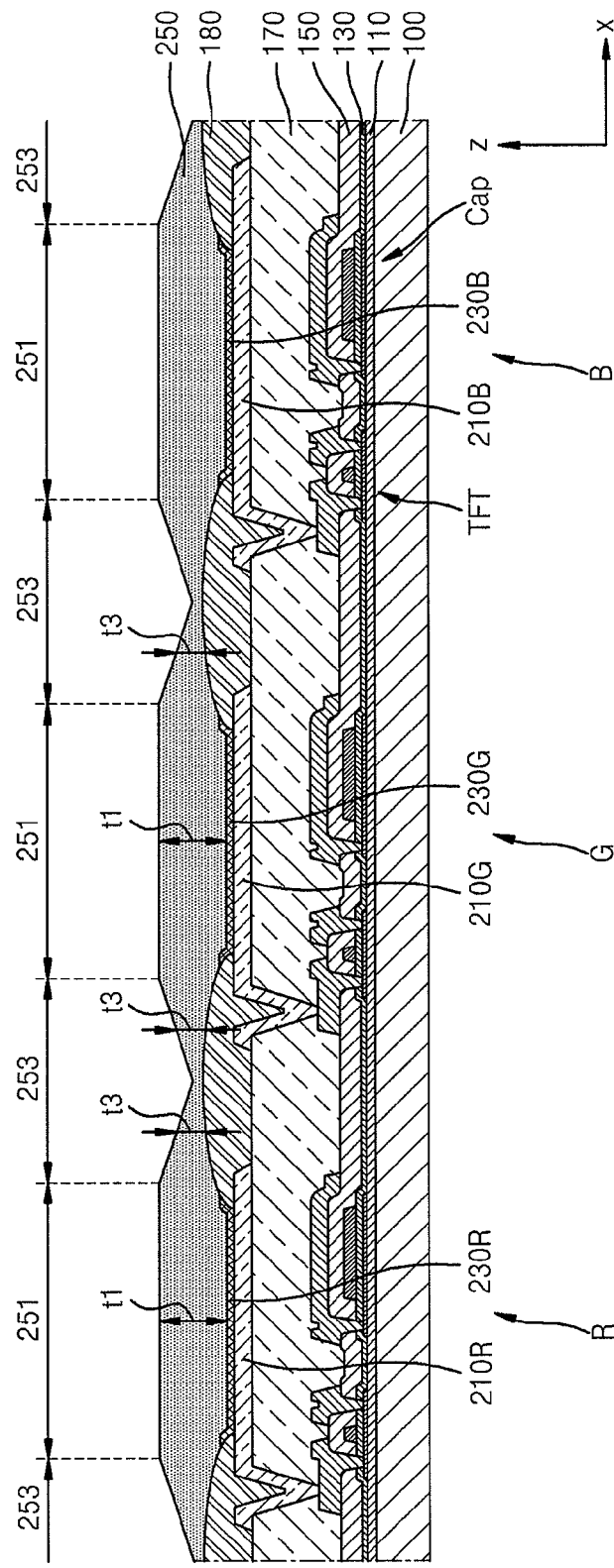
FIG. 3 is a cross-sectional view schematically illustrating a portion of an OLED display according to another embodiment.

FIG. 3 is a cross-sectional view schematically illustrating a portion of an OLED display according to another embodiment. In the OLED display according to another embodiment, an opposite electrode 250 includes a plurality of first portions 251, which are separated from each other, and a plurality of third portions 253 which are formed between the first portions 251 and become gradually thinner as being farther away from the first portions 251. That is, as illustrated in FIG. 3, the OLED display according to another embodiment may not include the second portion 252.

In the OLED display according to an embodiment, the thickness of the opposite electrode 250 is changed depending on a position, and thus, a change in a color balance is minimized despite a change in a viewing angle.

As illustrated in FIG. 3, when the user views the OLED display from the front which is substantially vertical to the screen of the OLED display, most of output light recognized by the user passes through the first portion 251 of the opposite electrode 250, and thus, the length of a light path in the opposite electrode 250 corresponds to the thickness t1 of the first portion 251 of the opposite electrode 250. When the user views the OLED display in an askew direction which is not vertical to the screen of the OLED display, most of the output light recognized by the user passes through the third portion 253 of the opposite electrode 250. In this case, since the thickness t3 of the third portion 253 of the opposite electrode 250 is less than the thickness t1 of the first portion 251, and thus, when the user views the OLED display in an askew direction, the length of the light path in the opposite electrode 250 is reduced compared to a case in which the thickness of the opposite electrode 250 is uniform anywhere. Therefore, in the OLED display according to an embodiment, the length of the light path in the opposite electrode 250 is prevented from rapidly increasing despite a change in a viewing angle, and thus, a color balance of an image recognized by the user is not greatly changed.

Figure 4:
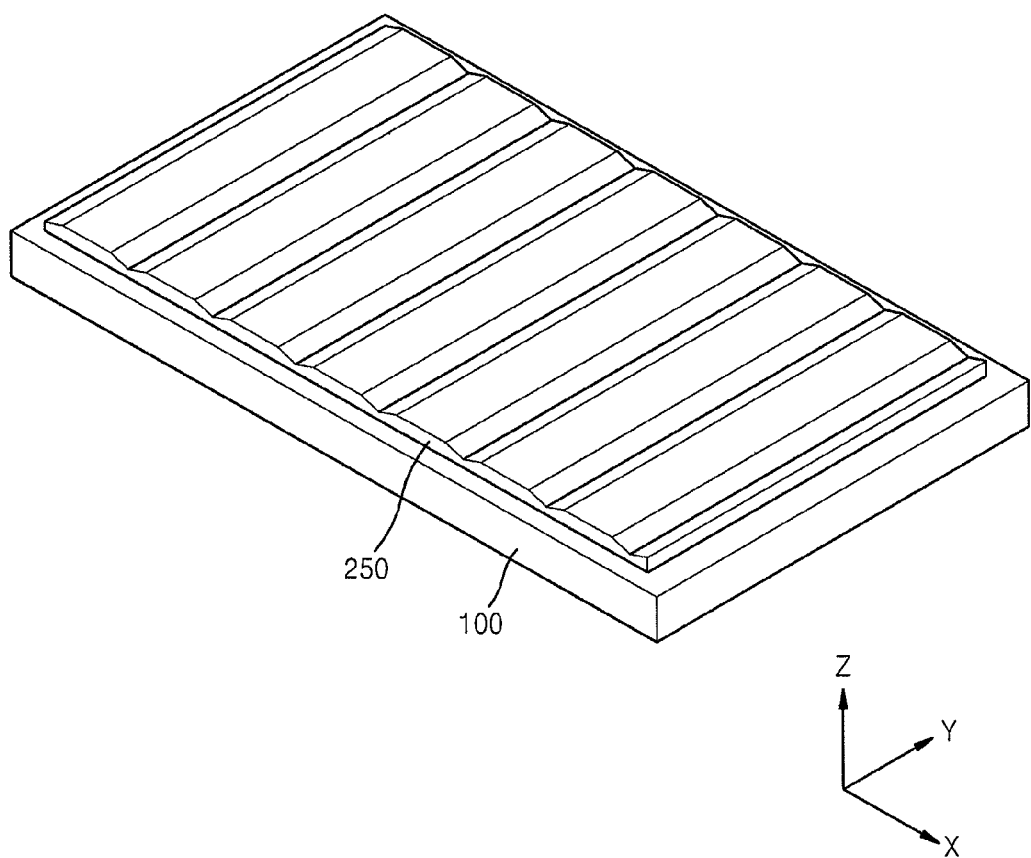
FIG. 4 is a perspective view schematically illustrating a portion of an OLED display according to another embodiment.

FIG. 4 is a perspective view schematically illustrating a portion of an OLED display according to another embodiment. In FIG. 4, a substrate 100 is illustrated as having a plate shape which has a long axis in an x axis direction and a short axis in a y axis direction. For reference, in FIG. 4, for convenience, only the substrate 100 and the opposite electrode 250 are illustrated, and even in a case of a shape of the opposite electrode 250, a bending of a lower surface formed by a pixel defining layer 180 formed thereunder is omitted. Furthermore, in FIG. 4, in a case of the opposite electrode 250 including the first portions 251 corresponding to (sub) pixels, sizes of the first portions 251 are exaggerated compared to actual sizes of the (sub)pixels.

As illustrated in FIG. 4, the opposite electrode 250 may include the first portion 251 and the third portion 253 which are alternately formed along the long axis direction (which is the x axis direction) of the substrate 100. However, the thickness of the opposite electrode 250 may be constant along the short axis direction (which is the y axis direction) of the substrate 100. This is because in a state where the OLED display is formed so that the long axis of the substrate 100 is formed to correspond to a left and right direction of a viewer, the viewer views an image displayed by the OLED display, and moreover, a viewing angle is changed in the long axis direction of the substrate 100, but the viewing angle is not changed in the short axis direction of the substrate 100. Therefore, the thickness of the opposite electrode 250 is constant along the short axis direction (which is the y axis direction) of the substrate 100, and thus, a shape of the opposite electrode 250 is simplified, thereby facilitating a manufacturing process. Also, despite a change in a viewing angle, a color balance is maintained in the long axis direction of the substrate 100. Depending on the case, the opposite electrode 250 may include the first portion 251 and the third portion 253 which are alternately formed along the short axis direction (which is the y axis direction) of the substrate 100.

So far, the OLED display has been mainly described, but the present invention is not limited thereto. For example, a method of manufacturing the OLED display is within the scope of the present invention. That is, a method of manufacturing the OLED display according to an embodiment includes forming plurality of pixel electrodes 210R, 210G and 210B, which are separated from each other, on the substrate 100, forming the plurality of intermediate layers 230R, 230G and 230B, including at least an emission layer, on the pixel electrodes 210R, 210G and 210B, and forming the opposite electrode 250 as one body on the plurality of intermediate layers 230R, 230G and 230B to correspond to the pixel electrodes 210R, 210G and 210B so that thickness of the opposite electrode 250 is changed depending on a position. Therefore, an OLED display in which a color balance is not greatly changed despite a change in a viewing angle may be manufactured.

Figure 5:
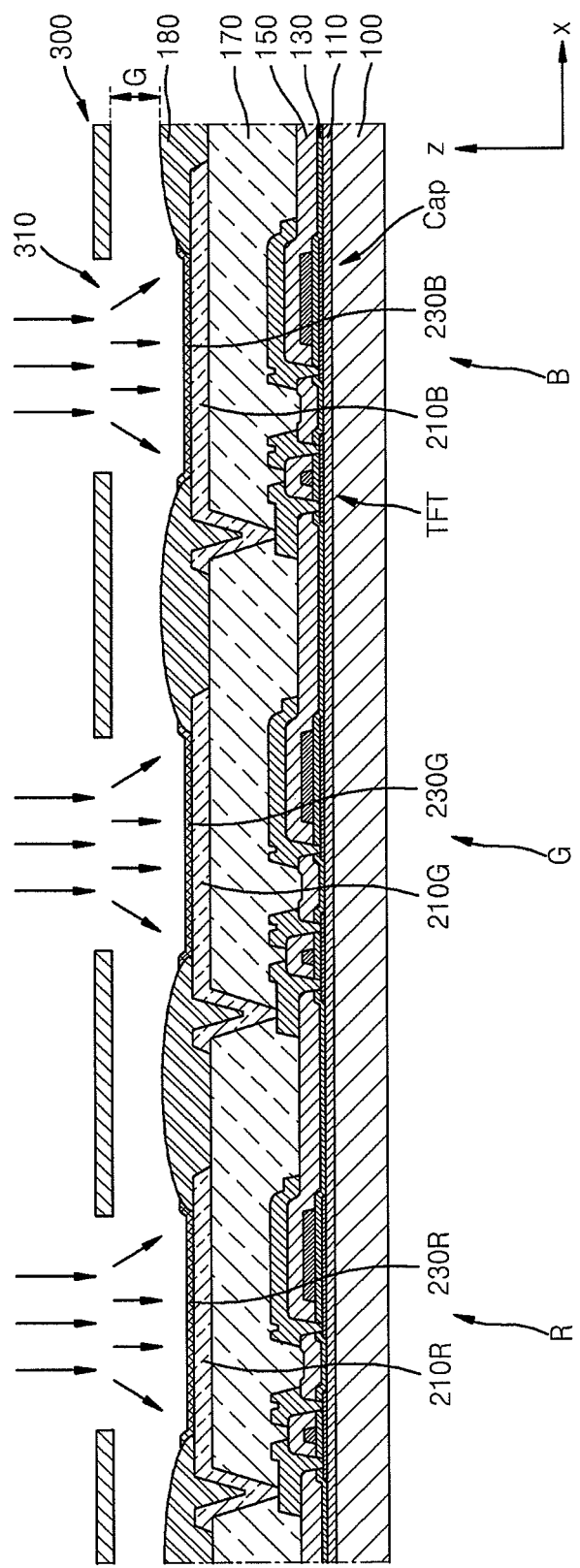
FIG. 5 is a cross-sectional view schematically illustrating a process of a method of manufacturing an OLED display according to an embodiment.

As illustrated in FIG. 5 that is a cross-sectional view schematically illustrating a process of a method of manufacturing an OLED display according to an embodiment, the forming the opposite electrode 250 may be depositing a material for forming the opposite electrode 250 in a state where a mask 300 having a plurality of openings 310 is separated from a surface, in which the opposite electrode 250 is to be formed, by a predetermined distance G. In this case, in the surface where the opposite electrode 250 is to be formed, the material for forming the opposite electrode 250 is relatively more deposited on a portion which is formed at a central portion of each of the openings 310, and the material for forming the opposite electrode 250 is relatively less deposited on a portion between the openings 310. Therefore, the first portions 251 having a relatively thick thickness t1, the second portions 252 having a relatively thin thickness t2, and the third portions 253 that connect the first portions 251 to the second portions 252 are formed.

In the surface where the opposite electrode 250 is to be formed, the reason that the material for forming the opposite electrode 250 is deposited on the portion between the plurality of openings 310 is because the material for forming the opposite electrode 250 is deposited in a state where the mask 300 having the openings 310 is separated from the surface, in which the opposite electrode 250 is to be formed, by the predetermined distance G. The opposite electrode 250, including the first portions 251 corresponding to centers of the plurality of openings 310 of the mask 300, the second portions 252 which correspond to a portion between the openings 310 of the mask 300 and have a thinner thickness than those of the first portions 251, and the third portions 253 which connect the first portions 251 to the second portions 252 and become gradually thinner in a direction from a position (which is adjacent to the first portion 251) to a position adjacent to the second portion 252, may be formed by using a shadow effect.

For reference, that a conductive layer having a uniform thickness is formed and the opposite electrode 250 having a non-uniform thickness is formed by patterning the conductive layer may be considered. However, since the intermediate layers 230R, 230G and 230B including the emission layer is formed before forming the opposite electrode 250, the intermediate layers 230R, 230G and 230B is damaged in a patterning process, namely, an etching process. However, in the method of manufacturing the OLED display according to an embodiment, the opposite electrode 250 is formed by performing a deposition process with the mask 300 having the plurality of openings 310, and the deposition process is performed in a state where the mask 300 is separated from the surface, in which the opposite electrode 250 is to be formed, by the predetermined distance G. Accordingly, the opposite electrode 250 having a non-uniform thickness is effectively formed without damaging the intermediate layers 230R, 230G and 230B.

As described above, the substrate 100 has the plate shape which has the long axis and the short axis. In this case, the forming the opposite electrode 250 may be forming the opposite electrode 250 which includes the first portion 251, the third portion 253, and the second portion 252 which are alternately formed along the long axis of the substrate 100. Even in a case of the short axis direction of the substrate 100, the opposite electrode 250 may have a type similar to a case of the long axis direction, and the thickness of the opposite electrode 250 may be uniform along the short axis direction.

Even when the opposite electrode 250 is formed by using the shadow effect of the mask 300, the opposite electrode 250, including the first portions 251 corresponding to centers of the plurality of openings 310 of the mask 300 and the third portions 253 which correspond to a portion between the plurality of openings 310 of the mask 300 and become gradually thinner as being farther away from the first portion 251, may be formed.

As described above, the substrate 100 has the plate shape which has the long axis and the short axis. In this case, the forming the opposite electrode 250 may be forming the opposite electrode 250 which includes the first portion 251 and the third portion 253 which are alternately formed along the long axis of the substrate 100. Even in a case of the short axis direction of the substrate 100, the opposite electrode 250 may have a type similar to a case of the long axis direction, and the thickness of the opposite electrode 250 may be uniform along the short axis direction.

As described above, the first portions 251 of the opposite electrode 250 correspond to the centers of the pixel electrodes 210R, 210G and 210B, and thus, in a process of forming the opposite electrode 250, the material for forming the opposite electrode 250 is deposited in a state where the mask 300 is formed so that the centers of the openings 310 of the mask 300 correspond to the centers of the plurality of pixel electrodes 210R, 210G and 210B.

As described above, according to the one or more of the above embodiments, the OLED display and the method of manufacturing the same which enable a user to appreciate a high-quality image are implemented.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been described with reference to the drawings, it will be understood by those of ordinary skill in the art that various changes in form and details may be made therein without departing from the spirit and scope of the present invention as defined by the following claims.

What is claimed is:

1. An organic light-emitting diode (OLED) display comprising:
   a substrate;
   a plurality of pixel electrodes on the substrate and separated from each other;
   an opposite electrode corresponding to the plurality of pixel electrodes; and
   an intermediate layer between the plurality of pixel electrodes and the opposite electrode, wherein the intermediate layer includes a layer corresponding to the plurality of pixel electrodes or a layer patterned to correspond to the plurality of pixel electrodes,
   wherein the opposite electrode comprises a first portion being substantially directly above a center portion of a corresponding pixel electrode, a second portion, and a third portion interconnecting the first portion and the second portion,
   wherein a thickness of the first portion is greater than a thickness of the second portion,
   wherein the third portion becomes gradually thinner in a direction from a position, which is adjacent to the first portion, to a position adjacent to the second portion, and
   wherein a greatest distance between a top surface of the first portion and the substrate is greater than a greatest distance between a top surface of the third portion and the substrate.

2. The OLED display of claim 1, wherein the substrate has a plate shape which has a long axis and a short axis, and wherein the third portion, the first portion, the third portion, and the second portion repeatedly appear along a direction of the long axis of the substrate.

3. The OLED display of claim 2, wherein the third portion, the first portion, the third portion, and the second portion repeatedly appear along a direction of the short axis of the substrate.

4. The OLED display of claim 2, wherein the thickness of the opposite electrode is substantially uniform along a direction of the short axis of the substrate.

5. The OLED display of claim 1, wherein the thickness of the first portion of the opposite electrode is substantially uniform.

6. An organic light-emitting diode (OLED) display comprising:
   a substrate;
   a plurality of pixel electrodes on the substrate and separated from each other;
   a pixel defining layer covering an edge of each of the plurality of pixel electrodes;
   an opposite electrode corresponding to the plurality of pixel electrodes; and
   an intermediate layer between the plurality of pixel electrodes and the opposite electrode, wherein the intermediate layer includes a layer corresponding to the plurality of pixel electrodes or a layer patterned to correspond to the plurality of pixel electrodes,
   wherein the opposite electrode comprises a plurality of protrusions spaced apart from each other, the protrusions are located substantially directly above central portions of the pixel electrodes, and a greatest distance between a top surface of each of the protrusions and the substrate is greater than a greatest distance between a top surface of a remaining portion of the opposite electrode and the substrate, the remaining portion being a portion of the opposite electrode other than the protrusions and not corresponding to the pixel defining layer.

7. A method of manufacturing an organic light-emitting diode (OLED) display, the method comprising:
forming a plurality of pixel electrodes, which are separated from each other, on a substrate;
forming an intermediate layer over the plurality of pixel electrodes, the intermediate layer including a layer corresponding to the plurality of pixel electrodes or a layer patterned to correspond to the plurality of pixel electrodes; and
forming an opposite electrode as one body, which corresponds to the pixel electrodes, on the intermediate layer, wherein the thickness of the opposite electrode varies depending on a position,
wherein the forming of the opposite electrode comprises depositing a material for forming the opposite electrode in a state where a mask having a plurality of openings is separated from a surface, in which the opposite electrode is to be formed, by a predetermined distance,
wherein the forming of the opposite electrode comprises depositing the material for forming the opposite electrode in a state where the mask is formed so that central portions of the openings of the mask correspond to central portions of the pixel electrodes, and
wherein the forming of the opposite electrode comprises forming the opposite electrode that includes i) a plurality of first portions corresponding to the central portions of the openings of the mask, ii) a plurality of second portions which correspond to a portion between the openings of the mask, and iii) a plurality of third portions which connect the plurality of first portions to the plurality of second portions and become gradually in a direction from a position, which is adjacent to a corresponding first portion, to a position adjacent to a corresponding second portion.

8. The method of claim 7, wherein the substrate has a plate shape which has a long axis and a short axis, and wherein the third portion, the first portion, the third portion, and the second portion repeatedly appear along a direction of the long axis of the substrate.

9. The method of claim 8, wherein the forming of the opposite electrode comprises forming the opposite electrode such that the thickness of the opposite electrode is substantially uniform along a direction of the short axis of the substrate.

10. A method of manufacturing an organic light-emitting diode (OLED) display, the method comprising:
forming a plurality of pixel electrodes, which are separated from each other, on a substrate;
forming an intermediate layer over the plurality of pixel electrodes, the intermediate layer including a layer corresponding to the plurality of pixel electrodes or a layer patterned to correspond to the plurality of pixel electrodes; and
forming an opposite electrode as one body, which corresponds to the pixel electrodes, on the intermediate layer, wherein the thickness of the opposite electrode varies depending on a position,
wherein the forming of the opposite electrode comprises depositing a material for forming the opposite electrode in a state where a mask having a plurality of openings is separated from a surface, in which the opposite electrode is to be formed, by a predetermined distance,
wherein the forming of the opposite electrode comprises depositing the material for forming the opposite electrode in a state where the mask is formed so that central portions of the openings of the mask correspond to central portions of the pixel electrodes, and wherein the forming of the opposite electrode comprises forming the opposite electrode that includes a plurality of first portions corresponding to the central portions of the openings of the mask and a plurality of third portions which correspond to a portion between the openings of the mask and become gradually thinner as being farther away from a corresponding first portion.

11. The method of claim 10, wherein the substrate has a plate shape which has a long axis and a short axis, and wherein the first portions and the third portions are alternately appear along a direction of the long axis of the substrate.

* * * * *